(12) United States Patent
Huang

(10) Patent No.: US 7,118,392 B2
(45) Date of Patent: Oct. 10, 2006

(54) ELECTRICAL CONNECTOR AND METHOD FOR MANUFACTURING SAME

(75) Inventor: Yao-Chi Huang, Tu-Chen (TW)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 11/099,183

(22) Filed: Apr. 4, 2005

(65) Prior Publication Data

US 2005/0231902 A1   Oct. 20, 2005

(30) Foreign Application Priority Data

Apr. 16, 2004   (TW)   ............................... 93110609 A

(51) Int. Cl.
*H01R 12/00*   (2006.01)

(52) U.S. Cl. ...................................................... 439/83

(58) Field of Classification Search ................. 439/83, 439/81, 70, 71, 66, 82
See application file for complete search history.

(56) References Cited

U.S. PATENT DOCUMENTS 4,682,829 A * 7/1987 Kunkle et al. ................ 439/83
2004/0196061 A1 * 10/2004 Hoppe ......................... 324/765

* cited by examiner

*Primary Examiner*—Phuong Dinh
(74) *Attorney, Agent, or Firm*—Wei Te Chung

(57) ABSTRACT

An electrical connector (10) includes a housing (20) defining an upper surface (22) and a bottom surface (23), and a plurality of terminals (30) received in the housing. The housing defines a plurality of passageways (21) for accommodating the terminals therein. Each terminal comprises a contacting portion (31), a medial portion (32) fastened in the passageway, and a soldering portion (33) extending below the bottom surface. The medial portion defines a pair of wings (320) extending toward the soldering portion. A distance is configured between distal ends of the wings and the bottom surface of the housing. A method for manufacturing said electrical connector comprises such steps as: locating the soldering portions in corresponding recesses of a tool, pushing the tool toward the housing along a direction from the bottom surface to the upper surface, till a predetermined distance is configured between distal ends and the bottom surface.

14 Claims, 5 Drawing Sheets

ELECTRICAL CONNECTOR AND METHOD FOR MANUFACTURING SAME

BACKGROUND OF THE INVENTION

1. Field of the Invention

The present invention relates to an electrical connector used for electrically connecting an integrated circuit (IC) module, such as a central processing unit (CPU), to a circuit substrate, such as a printed circuit board (PCB).

2. Description of the Related Art

Modern computer systems increase in performance and complexity at a very rapid pace, driven by intense competition and market demands. A CPU is generally mounted to a PCB via an electrical connector, such as a CPU socket, for replacing a new CPU when the original CPU is spoiled.

A typical such electrical connector 90 is shown in FIG. 7. The conventional electrical connector 90 comprises an insulative housing 60 and a plurality of conductive terminals 70 accommodated in the housing 60. The housing 60 defines an upper surface 61, a bottom surface 62, and a plurality of passageways 63 communicating the upper surface 61 and the bottom surface 62. Each of the passageways 63 receives a terminal 70 therein. Each of the terminals 70 comprises a contacting portion 71 extending above the upper surface 61, a medial portion 72 fastened in the corresponding passageway 63, and a soldering portion 73 extending below the bottom surface 62. The medial portion 72 defines a pair of wings 720 extending toward the soldering portion 73. The two wings 720 of each terminal 70 are used for cooperating with a tool 80 (referring to FIGS. 8–9) for installing the corresponding terminal 70 into the passageway 63 of the housing 60. In the conventional connector 90, distal ends of wings 720 are coplanar with the bottom surface 62 of the housing.

FIGS. 8–9 illustrate an installing process of the terminal 70. The soldering portions 73 of the terminals 70 are located in recesses 81 of a tool 80, and the wings 720 abut against a top surface of the tool 80. The tool 80 is then pushed toward the housing 60, and the terminals 70 are accordingly inserted into the passageways 63 along a direction from the bottom surface 62 to the upper surface 61. The installing process of the terminals 70 is completed when the top surface of the tool 80 contacts with the bottom surface 62 of the housing 60. As a result, the distal ends of the wings are coplanar with the bottom surface 62 of the housing 60.

In order to obtain reliable electrical connection with the CPU, all the contacting portions 71 are required to be configured in the same level, i.e., distal ends of all the contacting portions 71 are configured in one plane. However, it is too difficult to configure all the distal ends of the contacting portions in one plane, because current manufacturing precision is not enough. After the terminals 70 are installed in the passageways 63, it is difficult to adjust the warp because there's no operating portion for the tool 80 to act on. The only two portions, which can be acted by the tool, are soldering portions 73 and contacting portions 71. However, the two portions are easy to be inflected. In this case, the conventional connector cannot provide reliable and fine electrical connection as a medium between the CPU and the PCB.

Hence, a new electrical connector and a new manufacturing method are desired to overcome the above-described disadvantages.

SUMMARY OF THE INVENTION

An object of the present invention is to provide an electrical connector which enables reliable and fine electrical connection between an integrated circuit and a circuit substrate.

Another object of the present invention is to provide an electrical connector, in which terminals are adjustable.

A third object of the present invention is to provide a manufacturing method to obtain an electrical connector, in which terminals are adjustable.

In order to achieve the aforementioned objects, an electrical connector in accordance with a preferred embodiment of the present invention comprises an insulative housing defining an upper surface and a bottom surface, and a plurality of terminals received in the housing. The housing defines a plurality of passageways communicating the upper and bottom surfaces for accommodating the terminals therein. Each of the terminals comprises a contacting portion extending above the upper surface, a medial portion fastened in the corresponding passageway, and a soldering portion extending below the bottom surface. The medial portion defines a pair of wings extending toward the soldering portion. A distance is configured between distal ends of the wings and the bottom surface of the housing. A method for manufacturing said electrical connector comprises such steps as: locating the soldering portions in corresponding recesses of a tool, pushing the tool toward the housing along a direction from the bottom surface to the upper surface, till a predetermined distance is configured between distal ends and the bottom surface. Therefore, the wings of each terminal are located below the bottom surface. When it is necessary to adjust the terminals, the wings are provided to be acted by the tool.

Other objects, advantages and novel features of the present invention will become more apparent from the following detailed description when taken in conjunction with the accompanying drawings, in which:

DESCRIPTION OF THE PREFERRED EMBODIMENT

Figure 1:
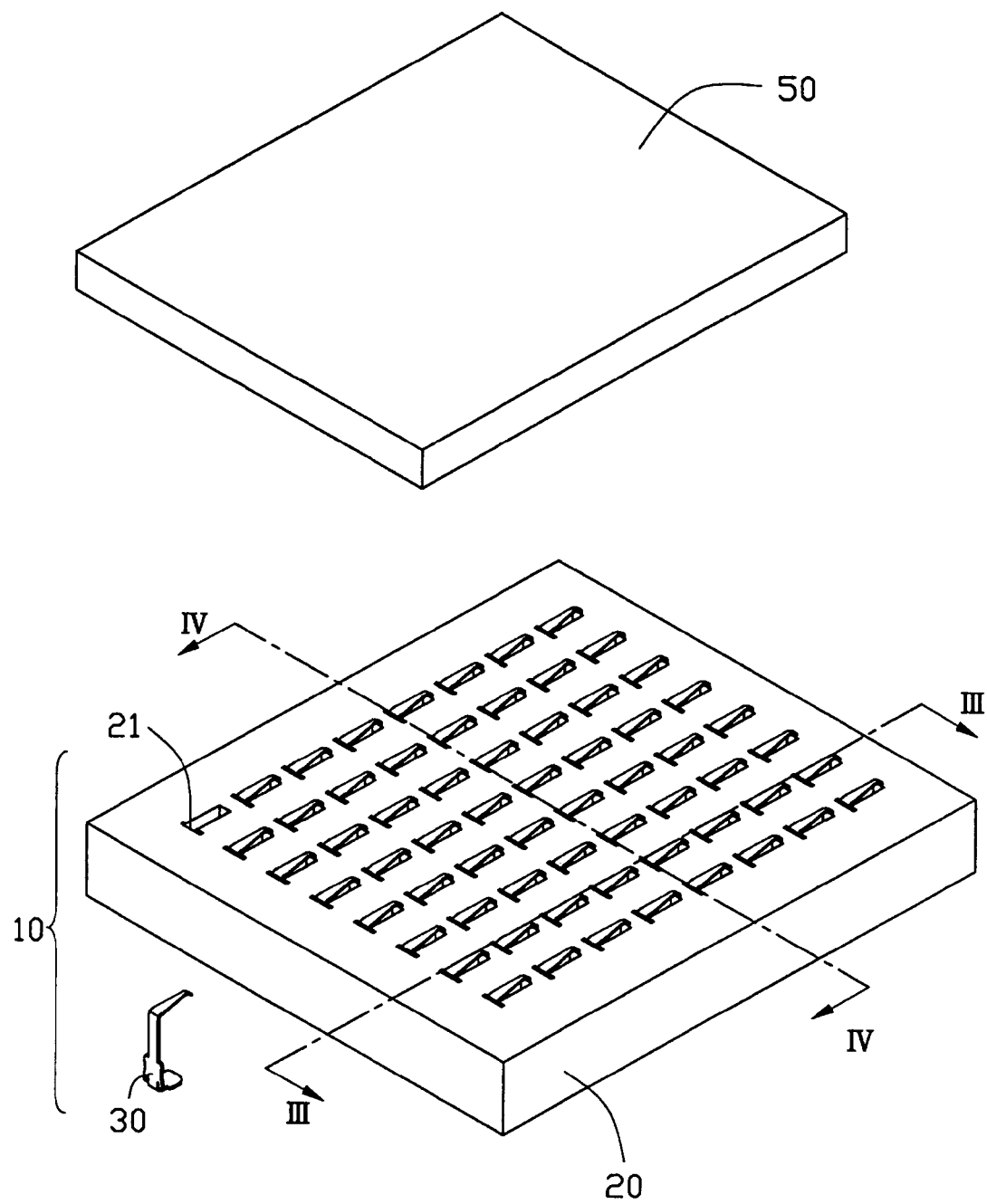
FIG. 1 is an isometric view of an electrical connector in accordance with the preferred embodiment of the present invention, shown with an integrated circuit to be mounted thereon.
Figure 2:
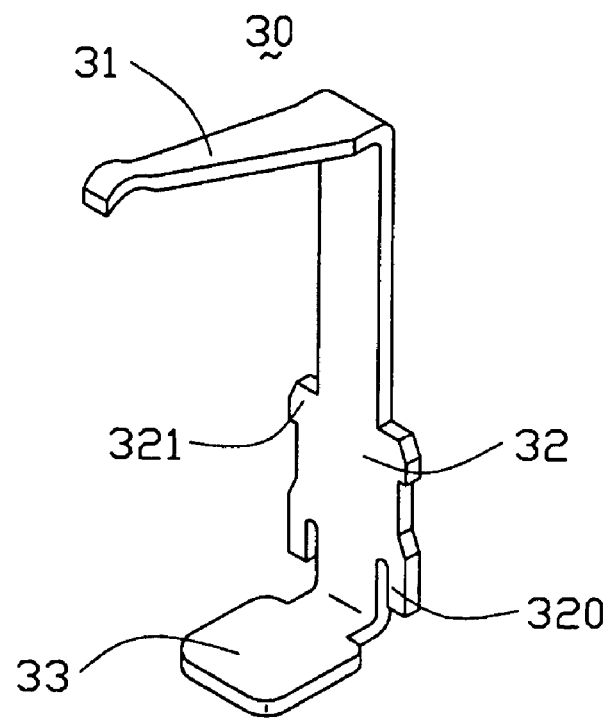
FIG. 2 is an isometric view of a terminal of the electrical connector.
Figure 3:
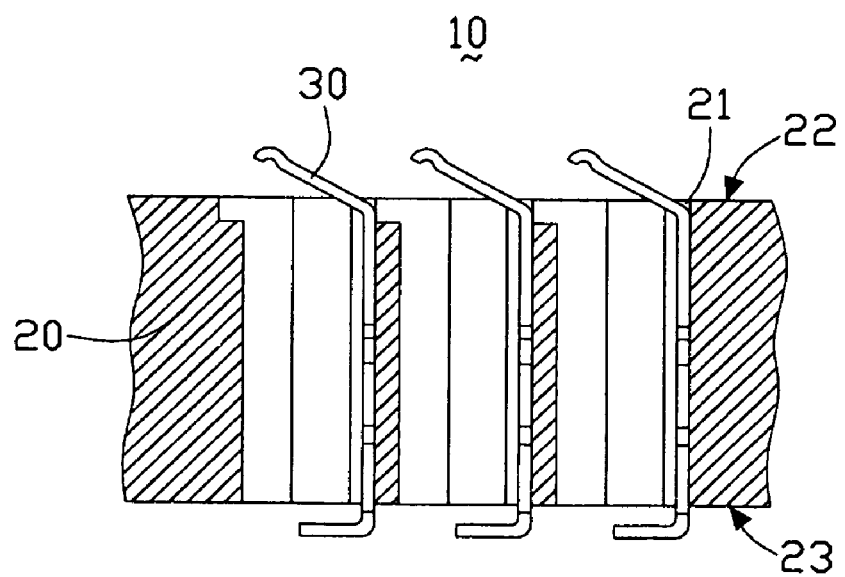
FIG. 3 is a cross-sectional view taken along line III—III of FIG. 1.
Figure 4:
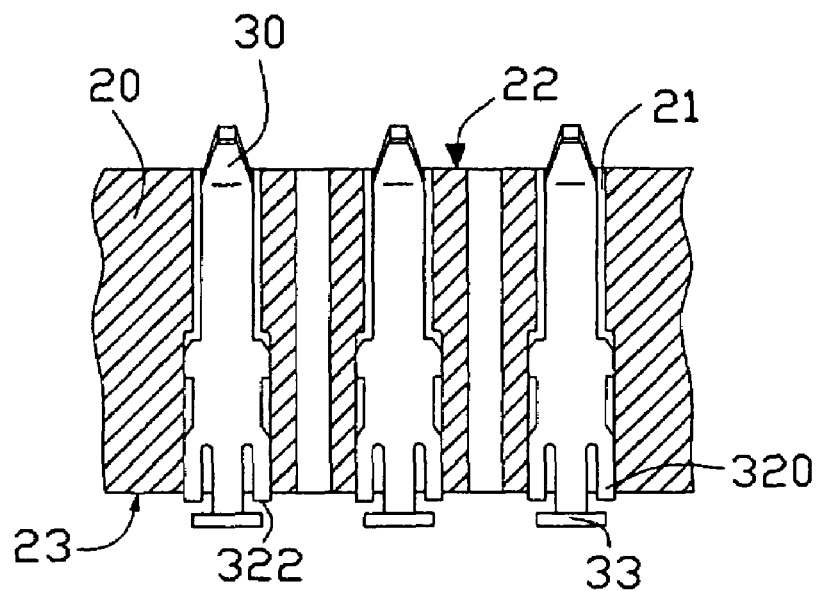
FIG. 4 is a cross-sectional view taken along line IV—IV of FIG. 1.

Reference will now be made to the drawing figures to describe the present invention in detail.

Referring to FIGS. 1–4, an electrical connector 10 in accordance with a preferred embodiment of the present invention is used to connecting an integrated circuit 50 and a circuit substrate (not shown) and comprises an insulative housing 20 defining an upper surface 22 and a bottom surface 23, and a plurality of terminals 30 received in the housing 20. The housing 20 defines a plurality of passageways 21 communicating the upper and bottom surfaces 22, 23 for accommodating the terminals 30 therein.

Each of the terminals 30 comprises a contacting portion 31 extending above the upper surface 22 for connecting with the integrated circuit, a flat medial portion 32 fastened in the corresponding passageway 21, and a soldering portion 33 extending below the bottom surface 23 for connecting with the circuit substrate. The soldering portion 33 is substantially perpendicular to the medial portion 32. The contacting portion 31 extends obliquely from the medial portion 32. The medial portion 32 defines a plurality of protrusions 321 for increase interfering force between the medial portion 32 and the corresponding passageway 21. The medial portion 32 further defines a pair of symmetrical wings 320 extending toward the soldering portion 33. When the terminals 30 are installed in the passageways 21, a predetermined distance is configured between distal ends 322 of the wings 320 and the bottom surface 23 of the housing 20.

Figure 5:
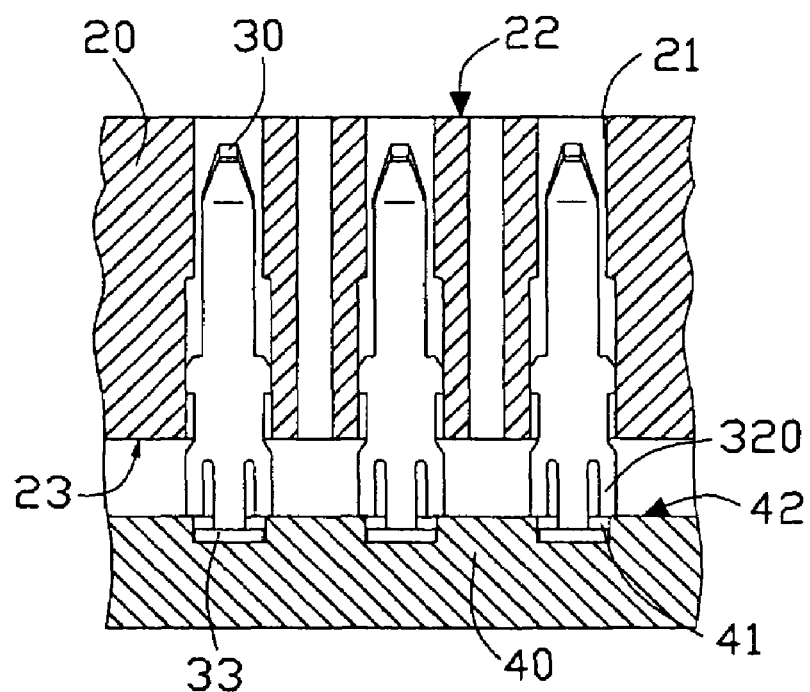
FIG. 5 is a cross-sectional view illustrating the terminals not installed completely in a housing of the electrical connector, shown with a tool for installing the terminals into the housing.
Figure 6:
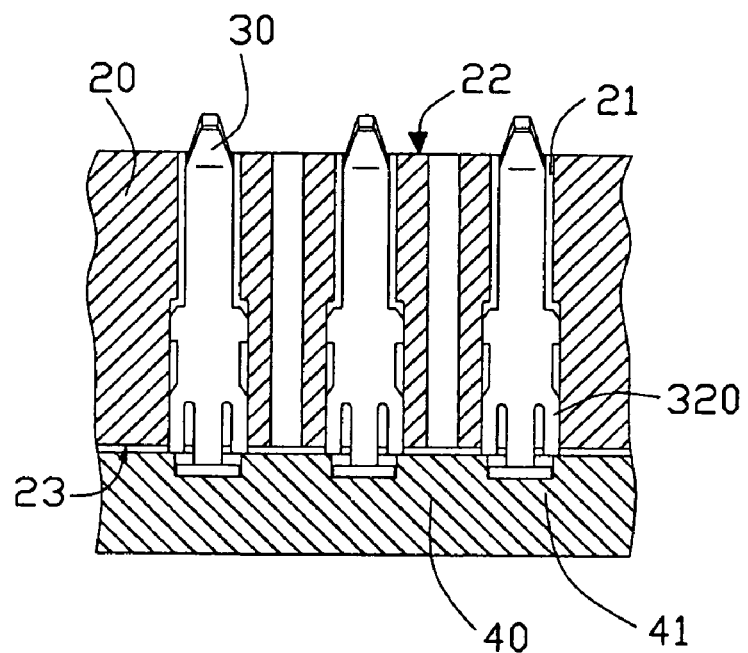
FIG. 6 is similar to FIG. 5, but shown the terminals installed completely in the housing.
Figure 7:
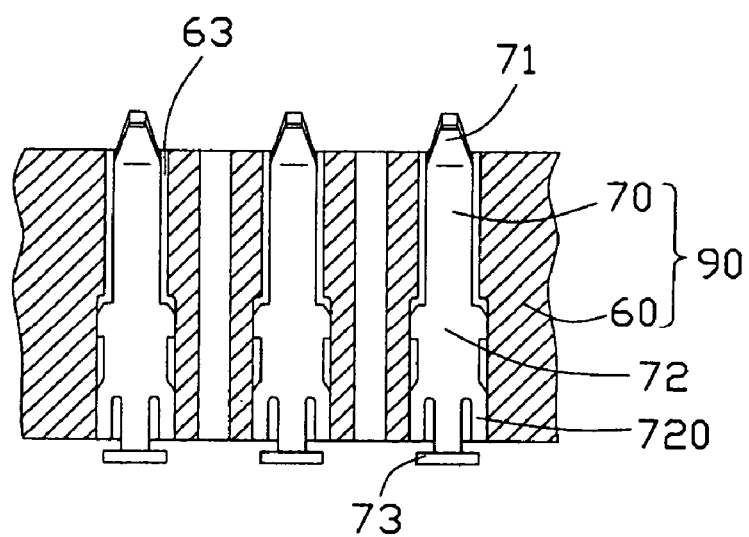
FIG. 7 is a cross-sectional view of a conventional electrical connector.
Figure 8:
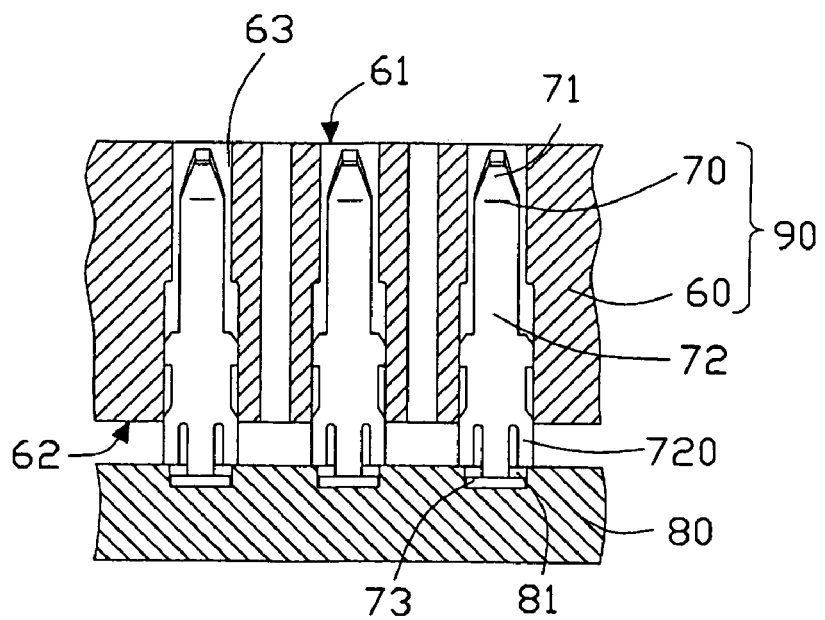
FIG. 8 is a cross-sectional view illustrating terminals not installed completely in a housing of the conventional electrical connector, shown with a tool for installing the terminals into the housing.
Figure 9:
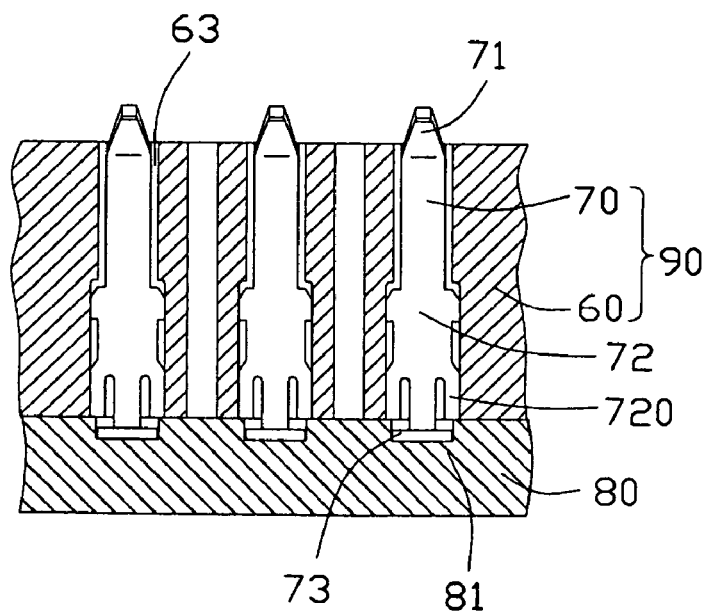
FIG. 9 is similar to FIG. 8, but shown the terminals installed completely in the housing.

Referring to FIGS. 5–6, a method for manufacturing said electrical connector comprises such steps as: (a) providing an insulative housing 20 defining a plurality passageways 21 therethrough; (b) providing a plurality of terminals each defining a contacting portion 31, a medial portion 32, and a soldering portion 33, wherein the medial portion defines a pair of wings 320 extending toward the soldering portion 33; (c) providing a tool defining a plurality of recesses 41 corresponding to the terminals 30; (d) putting the soldering portions 33 into corresponding recesses 41 of the tool 40, and putting distal ends 322 of the wings 32 on a top surface 42 of the tool; and (e) pushing the tool 40 toward the housing 20 along a direction from the bottom surface 23 to the upper surface 22, till a predetermined distance is configured between distal ends 322 and the bottom surface 23. Therefore, the wings 320 of the terminals 30 are located below the bottom surface. When it is necessary to adjust the terminals 30, the wings 320 can be again put on the top surface 42 of the tool 40, so that the terminals 30 can be pushed by the tool 40.

In the preferred embodiment, the terminals 30 are inserted into the housing 20 along a direction from the bottom surface 23 of the housing 20 to the upper surface 22. In an alternative embodiment, the terminals can also be inserted into the housing along a direction from the upper surface to the bottom surface, as long as the distal ends of the wings are located between the bottom surface and the soldering portion.

While the present invention has been described with reference to a specific embodiment, the description is illustrative of the invention and is not to be construed as limiting the invention. Various modifications can be made to the preferred embodiment by those skilled in the art without departing from the true spirit and scope of the invention as defined by the appended claims.

What is claimed is:

1. An electrical connector used for electrically connecting an integrated circuit to a circuit substrate comprising:
    an insulative housing defining an upper surface, a bottom surface and a plurality of passageways communicating the upper and bottom surfaces;
    a plurality of terminals received in the corresponding passageways, each of the terminal defining a contacting portion for connecting with the integrated circuit, a medial portion fastened in the passageway and a soldering portion for connecting with the substrate; wherein
    the medial portion defines a plurality of wings located spatially beside said soldering portion while extending toward the soldering portion for engagement with a tool, and a predetermined distance is configured between distal ends of the wings and the bottom surface after the terminal is fully assembled to the housing with the distal ends of the wings being exposed below the bottom surface whrereby they can be acted upon by tools.

2. The electrical connector as described in claim 1, wherein the contacting port-ion of the terminal extends above the upper surface.

3. The electrical connector as described in claim 2, wherein the contacting portion of the terminal extends obliquely from the medial portion.

4. The electrical connector as described in claim 3, wherein the soldering portion is substantially perpendicular to the medial portion.

5. The electrical connector as described in claim 1, wherein the wings of the terminal are symmetrical about the medial portion.

6. The electrical connector as described in claim 1, wherein the medial portion of the terminal further defines a plurality of protrusions therefrom.

7. A method for manufacturing an electrical connector comprises the steps of:
    (a) providing an insulative housing defining an upper surface, a bottom surface, and a plurality of passageways spanning the upper and bottom surfaces;
    (b) providing a plurality of terminals corresponding to the passageways, each of the terminals being provided with a contacting portion, a medial portion, and a soldering portion, the medial portion being provided with a plurality of wings located spatially beside said soldering portion while extending toward the soldering portion;
    (c) providing a tool defining a top surface and a plurality of recesses corresponding to the terminals;
    (d) putting the soldering portions of the terminals into the recesses, respectively, and locating distal ends of the wings on the top surface;
    (e) inserting the terminals into the passageways by actuating the tool, and pushing the tool toward the housing, till the distal ends of the wings are below the bottom surface and a predetermined distance is configured between the distal ends of the wings and the bottom surface wherein said distance remains after fully assembly with the distal ends of the wings being exposed below the bottom surface whereby they can be acted upon by tools.

8. The method for manufacturing an electrical connector as described in claim 7, wherein in step (e), the terminals are inserted into the passageways along a direction from the bottom surface to the upper surface.

9. The method for manufacturing an electrical connector as described in claim 7, wherein in step (e), the terminals are inserted into the passageways along a direction from the upper surface to the bottom surface.

10. The method for manufacturing an electrical connector as described in claim 7, wherein in step (b), the wings are symmetrical about the medial portion.

11. The method for manufacturing an electrical connector as described in claim 7, wherein in step (b), the medial portion is further provided with a plurality of protrusions.

12. An electrical connector for electrically connecting a first plate-like electrical component to a second plate-like electrical component comprising:
  an insulative housing defining an upper surface for confrontation with said first plate-like electrical component, a bottom surface opposite to said upper surface for confrontation with said second plate-like electrical component, and a plurality of passageways communicatively extending between the upper surface and bottom surface; and
  a plurality of terminals received in the corresponding passageways, each of the terminal defining a resilient contacting portion extending upward above the upper surface for connecting with the first plate-like electrical component, a tail portion extending downwardly below the bottom surface for connecting with the second plate-like electrical component, and a medial portion located between the contacting portion and the tail portion to retain the corresponding terminal in the corresponding passageways; wherein
  the medial portion defines a tool engagement section essentially constantly extending below the bottom surface after fully assembled for allowing a manufacturing tool to engage therewith for further upwardly pushing the corresponding terminal to adjust a height of said contacting portion relative to the upper surface for compensating insufficient. engagement between the contacting portion and the first plate-like electrical component; wherein
  said tool engagement section is laterally spaced from the tail portion.

13. The electrical connector as described in claim 12, wherein said tail portion is equipped with solder for soldering upon the second plate-like electrical component.

14. The electrical connector as described in claim 12, wherein the passageway is configured with an upper narrow section and a lower wide section for allowing upward loading of the terminal thereinto.

* * * * *